United States Patent [19]

Hall et al.

[11] 4,186,221
[45] Jan. 29, 1980

[54] METHOD OF APPLYING GLASS LAYERS TO POLYCARBONATE

[75] Inventors: Walter L. Hall, Mt. Vernon, Ind.; James S. Humphrey, Jr., Clemmons, N.C.

[73] Assignee: General Electric Company, Pittsfield, Mass.

[21] Appl. No.: 959,585

[22] Filed: Nov. 13, 1978

[51] Int. Cl.$^2$ ............................................. B05D 7/24
[52] U.S. Cl. ........................................ 427/45; 428/412
[58] Field of Search ................. 427/45, 109, 162, 163, 427/164, 248 G; 428/412

[56] References Cited

U.S. PATENT DOCUMENTS

| 3,645,779 | 2/1972 | Kienel | 427/42 |
| 3,713,869 | 1/1973 | Geffcken et al. | 427/40 |

FOREIGN PATENT DOCUMENTS 1313866  4/1973  United Kingdom.

Primary Examiner—James R. Hoffman
Attorney, Agent, or Firm—Myron B. Kapustij; William F. Mufatti

[57] ABSTRACT

A method of providing a uniform and tenaciously adhered hard inorganic glass layer on a polycarbonate substrate which comprises vaporizing the glass in vacuum and precipitating said glass on the polycarbonate substrate using radio frequency induction heating means to vaporize said glass.

6 Claims, 2 Drawing Figures

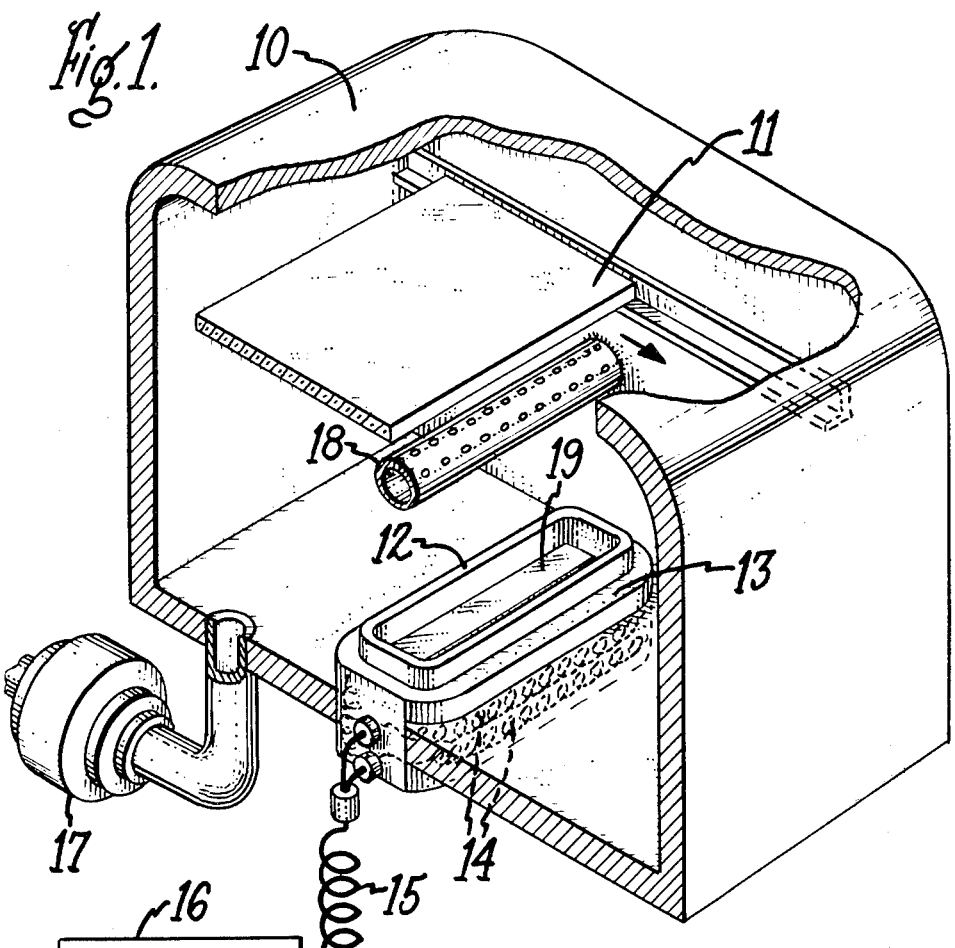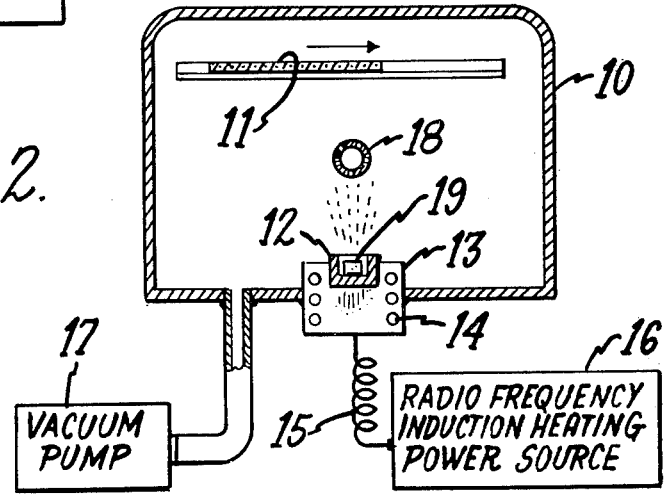

METHOD OF APPLYING GLASS LAYERS TO POLYCARBONATE

SUMMARY OF THE INVENTION

This invention relates to a method of depositing a thin protective hard inorganic glass layer onto a polycarbonate substrate. More particularly, the present invention relates to a method of vapor depositing a thin, uniform and tenaciously adhered inorganic glass layer onto a polycarbonate substrate by vaporizing glass in vacuum and precipitating the vaporized glass on the polycarbonate substrate using radio frequency induction heating means to vaporize the glass.

BACKGROUND OF THE INVENTION

Polycarbonate resins are well known, commercially available materials possessing excellent physical and chemical properties which are useful in a wide variety of applications. Such polymers or resins, since they are less dense and more breakage resistant than glass, have been especially useful as substitutes for glass as, for example, in the manufacture of tail lights and stop light lenses, protective shields for fluorescent street lights, safety shields in inspection windows, windshields, windows, and the like. However, these resins have relatively low mar and chemical solvent resistance.

In order to overcome this relatively low mar and chemical solvent resistance, polycarbonate articles have been coated with various organic and inorganic protective layers which increase the mar resistance of said polycarbonate articles. One type of inorganic protective layer is comprised of glass which has been vapor deposited onto the polycarbonate substrate. Thus, for example, French Patent Specification No. 1,520,125 and the corresponding British Specification No. 1,144,099 teach that the surfaces of polycarbonates can be improved, especially rendered more scratch resistant, by vapor depositing an $SiO_2$ layer of at least $1\mu$ thickness onto the polycarbonate. This vapor deposition is accomplished by evaporating $SiO_2$ with an electron beam evaporator source in a high vacuum in the presence of oxygen while regularly moving the polycarbonate article to be coated in the vapor jet and/or the electron beam evaporator source in such a manner that at least 50 successive layers are evaporated onto the surface of the polycarbonate article.

However, the articles thus prepared have been found to be not entirely satisfactory since, under high stress or temperature changes, the $SiO_2$ protective layer tends to crack and/or separate from the polycarbonate article. In order to overcome this cracking and separation of the protective silicate glass layer, various modifications of the basic vapor deposition process have been proposed. Thus, British Pat. No. 1,313,866 teaches a polycarbonate having a vapor deposited protective layer consisting of $SiO_x$ and 5 to 10% zirconium oxide. Similarly, U.S. Pat. No. 3,645,779 teaches a synthetic polymer provided with a hard, abrasion-resistant surface free of fine hairline cracks by vapor depositing under vacuum onto the surface of said polymer a $B_2O_3$-$SiO_2$ glass containing less than 5 percent by weight of $Na_2O$. U.S. Pat. No. 3,713,869 teaches disposing an intermediate layer between the plastic substrate and the vapor deposited glass layer for the purpose of improving the adherence of said glass layer. This intermediate layer comprises a polymerization layer which is formed by subjecting low molecular organic vapors to a glow discharge operation and depositing the polymerization products on the substrate. The organic vapors are provided by organic compositions such as acetylene, xylol, and those compounds which contain Si, preferably in a SiO bond, such as silicate acid methyl or silicic acid ethylester, and low boiling siloxanes.

Another disadvantage inherent in the prior art methods of vapor depositing glass, such as the aforedescribed methods of using an electron beam evaporator, resides in the fact that it is rather difficult to provide a glass coating which is of uniform thickness, has good adherence to the substrate, and possess good optical properties. This is due, in part, to the fact that the electron beam acts, in effect, as a point source, i.e., ejecting the $SiO_x$ particles of glass in a very narrow beam, with the thickness of the deposited glass layer being greatest at the point of impingement and decreasing at the areas peripheral to the point of impingement. This necessitates the application of several layers of glass to form a coating approaching uniformity of thickness.

With methods wherein radiant heating is used to vaporize the glass there are encountered the problems of heat deformation of the polycarbonate substrate. This heat deformation, besides having the obvious disadvantage, especially with large panels of polycarbonate to be used as glazing materials, of deforming the polycarbonate substrate also results in high tangential pressure forces being generated upon cooling of the coated substrate which leads to cracks in the glass layer and in separation of the glass layer from the polycarbonate substrate.

DESCRIPTION OF THE INVENTION

There is provided by the present invention a method of vapor depositing a uniformly thick and tenaciously adhered hard protective glass layer onto a polycarbonate substrate.

In the practice of this invention, any of the aromatic polycarbonates can be employed herein. These are homopolymers and copolymers and mixtures thereof that are prepared by reacting a dihydric phenol with a carbonate precursor. Typical of some of the dihydric phenols that may be employed in the practice of this invention are bisphenol-A (2,2-bis(4-hydroxyphenyl)propane), bix(4-hydroxyphenyl)methane, 2,2-bis(4-hydroxy-3-methylphenyl) propane, 3,3-bis(4-hydroxyphenyl)pentane, 2,2-bis(3,5-dichloro-4-hydroxyphenyl)propane, 2,2-bis(4,3,5-dibromo-4-hydroxyphenyl) propane, bis(3-chloro-4-hydroxyphenyl)methane. Other dihydric phenols of the bisphenol type are also available and are disclosed in U.S. Pat. Nos. 2,999,835, 3,028,365 and 3,334,154.

It is, of course, possible to employ two or more different dihydric phenols or a copolymer of a dihydric phenol with a glycol or with hydroxy or acid terminated polyester, or with a dibasic acid in the event a carbonate copolymer or interpolymer rather than a homopolymer is desired for use in the preparation of the aromatic carbonate polymers of this invention. Also employed in the practice of this invention may be blends of any of the above materials to provide the aromatic carbonate polymer.

The carbonate precursor may be either a carbonyl halide, a carbonate ester or a haloformate. The carbonyl halides which can be employed herein are carbonyl bromide, carbonyl chloride and mixtures thereof. Typical of the carbonate esters which may be employed herein are diphenyl carbonate, di-(halophenyl)carbonates such as di-(chlorophenyl) carbonate, di-(bromophenyl) carbonate, di-(trichlorophenyl) carbonate, di-(tribromophenyl) carbonate, etc., di-(alkylphenyl) carbonate such as di(tolyl) carbonate, etc., di-(naphthyl) carbonate, di-(chloronaphthyl) carbonate, phenyl tolyl carbonate, chlorophenyl chloronaphthyl carbonate, etc., or mixtures thereof. The haloformates suitable for use herein include bis-haloformates of dihydric phenols (bischloroformates of hydroquinone, etc.) of glycols (bishaloformates of ethylene glycol, neopentyl glycol, polyethylene glycol, etc.). While other carbonate precursors will occur to those skilled in the art, carbonyl chloride, also known as phosgene, is preferred.

Also included are the polymeric derivatives of a dihydric phenol, a dicarboxylic acid and carbonic acid. These are disclosed in U.S. Pat. No. 3,169,121 which is incorporated herein by reference.

The aromatic carbonate polymers of this invention may be prepared by employing a molecular weight regulator, an acid acceptor and a catalyst. The molecular weight regulators which can be employed in carrying out the process of this invention include monohydric phenols such as phenol, chroman-I, para-tertiarybutyl-phenol, para-bromophenol, primary and secondary amines, etc. Preferably, phenol is employed as the molecular weight regulator.

A suitable acid acceptor may be either an organic or an inorganic acid acceptor. A suitable organic acid acceptor is a tertiary amine and includes such materials as pyridine, triethylamine, dimethylaniline, tributylamine, etc. The inorganic acid acceptor may be one which can be either a hydroxide, a carbonate, a bicarbonate, or a phosphate of an alkali or alkaline earth metal.

The catalysts which are employed herein can be any of the suitable catalysts that aid the polymerization of bisphenol-A with phosgene. Suitable catalysts include tertiary amines such as, for example, triethylamine, tripropylamine, N,N-dimethylaniline, quaternary ammonium compounds such as, for example, tetraethylammonium bromide, cetyl triethyl ammonium bromide, tetra-n-heptyl-ammonium iodide, tetra-n-propyl ammonium bromide, tetramethyl ammonium chloride, tetramethyl ammonium hydroxide, tetra-n-butyl ammonium iodide, benzyltrimethylammonium chloride and quaternary pohsphonium compounds such as, for example, n-butyltriphenyl phosphonium bromide and methyltriphenyl phosphonium bromide.

Also included herein are branched polycarbonates wherein a polyfunctional aromatic compound is reacted with the dihydric phenol and carbonate precursor to provide a thermoplastic randomly branched polycarbonate.

These polyfunctional aromatic compounds contain at least three functional groups which are carboxyl, carboxylic anhydride, haloformyl or mixtures thereof. Examples of these polyfunctional aromatic compounds which may be employed in the practice of this invention include: trimellitic anhydride, trimellitic acid, trimellityl trichloride, 4-chloroformyl phthalic anhydride, pyromellitic acid, pyromellitic dianhydride, mellitic acid, mellitic anhydride, trimesic acid, benzophenonetetracarboxylic acid, benzophenonetetracarboxylic anhydride and the like. The preferred polyfunctional aromatic compounds are trimellitic anhydride or trimellitic acid, or their haloformyl derivatives.

Also included herein are blends of a linear polycarbonate and a branched polycarbonate.

The invention will now be described with reference to the two FIGURES of the drawings which illustrate in perspective and diagrammatically a preferred embodiment of the arrangement for practicing the method of the invention.

Inside the vacuum vessel 10 is disposed a crucible 12. This crucible is preferably of graphite and has a length greater than its width. Generally, the length of crucible 12 approximately corresponds to the width of polycarbonate panel 11 so that the entire width of the polycarbonate panel is exposed to approximately equal concentrations of a vaporized $SiO_x$ stream. The material to be vaporized 19, e.g., glass, quartz, $SiO_2$, etc., is placed in the crucible 12 which in turn is removably mounted in container 13. Container 13 contains radio frequency induction coils 14. In a preferred embodiment, the interior dimensions of container 13 generally correspond to the exterior dimensions of crucible 12. Container 13 is preferably of ceramic with the coils 13 encased therein. Radio frequency induction coils 13 are connected by means of power supply line 15 to a power supply source 16. The power supply source 16 can be a commercially available unit such as that sold by Applied Materials, Inc., California, under the tradename Pachydyne ® 50 Induction Heating Power Supply rated at 50 Kw 50 $KH_z$.

The vacuum chamber 10 is connected to a vacuum pump 17, such as a diffusion oil pump, used to provide the necessary low pressures needed. Disposed in the vacuum chamber is a hollow cylindrical member 18 containing a plurality of openings used to introduce oxygen into the vacuum chamber during the vapor deposition of glass onto the polycarbonate substrate.

In the practice of the method of the instant invention, crucible 12 is loaded with a vaporizable material such as glass or quartz. The glass or quartz consists mainly of $SiO_2$. Other types of glass, however, can also be used to provide the protective top layer in accordance with the present invention. Examples of these other types of hard inorganic glass include a glass consisting of $SiO_2$, $B_2O_3$, $Al_2O_3$ and $N_2O_3$; $HfO_x$; $ZrO_2$; and the like.

After the crucible is loaded with the vaporizable material, the vacuum chamber is evacuated to a pressure of from about $10^{-4}$ to about $10^{-6}$mm Hg. The radio frequency induction coils 14 are then energized with a rapidly oscillating electromagnetic field being produced inside the coils. The resultant vaporized stream of $SiO_x$, wherein x is 1 or 2, impinges and precipitates on the face 20 of the polycarbonate panel disposed towards the crucible 13. The polycarbonate panel, 11, which is movably mounted in vacuum chamber 10, is moved over the crucible in a direction shown by the arrow, i.e., a direction such that its longitudinal axis is transverse to the longitudinal axis of the crucible, thereby enabling the volatilized $SiO_x$ material to be evenly and uniformly deposited across the entire width of the panel as it passes over the crucible. Oxygen is introduced during the vapor deposition into the vacuum chamber 10, and more particularly into the vapor stream of $SiO_x$ emanating from the crucible to ensure that the $SiO_x$ stream is converted into $SiO_2$ particles by the time the $SiO_x$ stream impinges and is precipitated onto the polycarbonate panel.

The thickness of the $SiO_2$ layer deposited on the polycarbonate substrate can be controlled by varying the rate of travel of the polycarbonate panel over the crucible. The faster the rate of travel, the thinner the $SiO_2$ layer; the slower the rate of travel, the thicker the $SiO_2$ layer. Generally, the crucible is disposed about 10 inches below the polycarbonate panel and the rate of travel of the polycarbonate panel over the crucible is about 1 foot per minute. Generally, the thickness of the vapor deposited $SiO_2$ layer is in the range of from about 1 to about 10 microns, and preferably from about 2 to about 7 microns.

PREFERRED EMBODIMENTS OF THE INVENTION

In order to more fully and clearly illustrate the present invention, the following specific examples are presented. It is intended that the examples be considered as illustrative of rather than limiting the invention disclosed and claimed herein.

EXAMPLE 1

An aromatic polycarbonate is prepared by reacting 2,2-bis-(4-hydroxyphenyl)propane and phosgene in the presence of an acid acceptor and a molecular weight regulator and having an intrinsic viscosity of 0.57. The product is then fed into an extruder, which extruder is operated at about 265° C. and the extrudate is comminuted into pellets. The pellets are then injection molded at about 315° C. into test panels.

EXAMPLE 2

A polycarbonate test panel prepared substantially in accordance with Example 1 is placed into a vacuum deposition chamber containing a crucible about which is disposed a Radio Frequency Induction coil, said coil being connected to a power supply source. The power supply source is a commercially available unit sold by Applied Materials, Inc., California, under the tradename Pachydyne ® 50 Induction Heating Power Supply rated at 50 Kw 50 KHz. This power supply source is operated at between 15-30 Kw. The crucible, to which quartz is added, is located at a distance of 10 inches below the polycarbonate sheet. The crucible is positioned so that its longitudinal axis is transverse to the longitudinal axis and the direction of travel of the polycarbonate test panel thereby enabling the volatilized quartz material to be evenly deposited across the entire width of the test panel as it passes over the crucible. The vacuum deposition chamber is maintained at a pressure of approximately $1 \times 10^{-4}$ mm Hg and the polycarbonate test panel is transported across the crucible at a rate of 1 foot per minute. A coating of silicon dioxide 3 microns thick is evenly and uniformly deposited on the polycarbonate panel.

The glass coated polycarbonate panel prepared in accordance with Example 2 is subjected to a series of tests to determine the adhesion of the glass coat to the polycarbonate substrate and the abrasion resistance afforded the polycarbonate substrate by the glass coat.

The test to determine the adhesion of the glass coat to the polycarbonate substrate is a scribed adhesion test which consists of using a multiple blade tool to cut parallel grooves about 1 mm apart through the coating into the polycarbonate substrate, rotating the sample 90° and repeating the cutting process thereby forming a grid pattern of 1 mm squares cut into the coating and substrate, and applying an adhesive tape over the crosshatched area and quickly pulling said tape off. A sample fails and adhesion test if any of the coating on any of the squares is pulled off. The polycarbonate test panel prepared in accordance with Example 2 passed the scribed adhesion test.

The abrasion test is one wherein test panels having a ¼ inch diameter hole cut in the center are subjected to a Taber Abraser. The Taber Abraser is equipped with CS-10F wheels which are resurfaced every 200 cycles by abrading for 25 cycles on a S-11 refacing disc. The weights used in combination with the CS-10F wheels are 500 gm weights. Initial measurements of the % Haze are made at four places around the future wear track of the sample using a Gardner Hazemeter. The sample is abraded for 100 cycles, cleaned with isopropanol, and the % Haze is remeasured at the same four places. The four differences in % Haze are calculated and averaged to give the Δ% Haze. The results are set forth in Table II.

TABLE II

| Example No. | Abrasion Resistance Δ % Haze |
|---|---|
| 1 (uncoated polycarbonate panel) | 34 |
| 2 (glass coated polycarbonate panel) | 4.1 |

As can be seen from the above, the glass coatings provided by the method of the instant invention are adherent to the polycarbonate substrate and provide protection against abrasion to the polycarbonate substrate. This results in glass coated polycarbonate articles which can be utilized successfully in many commercial applications.

Having now fully described the invention, it will be apparent to one of ordinary skill in the art that many changes and modifications can be made thereto without departing from the spirit or scope of the invention as set forth herein.

What is claimed is:

1. A method of providing an adherent thin glass film of uniform thickness on a polycarbonate substrate which comprises the steps of:
   (i) producing a stream of vaporized glass by heating a source of glass by radio frequency induction in an evacuated chamber; and,
   (ii) passing a polycarbonate substrate through said stream of vaporized glass with the longitudinal axis of said substrate transverse to said stream of vaporized glass such that said stream of vaporized glass contacts and is uniformly deposited on the polycarbonate substrate surface exposed thereto.

2. The method according to claim 1 wherein said evacuated chamber is maintained at a pressure of from about $10^{-4}$ to about $10^{-6}$ mm Hg.

3. The method according to claim 1 wherein oxygen is introduced into said stream of vaporized glass.

4. The method according to claim 1 wherein the thickness of the glass film is varied by varying the rate of passage of said polycarbonate substrate through said stream of vaporized glass.

5. The method according to claim 4 wherein the thickness of said glass film ranges from about 1 to about 10 microns.

6. The method according to claim 1 wherein said glass film is comprised substantially of $SiO_2$.

* * * * *